United States Patent

Kuo

[11] Patent Number: 5,679,214
[45] Date of Patent: Oct. 21, 1997

[54] METHOD OF MAINTAINING A STRONG ENDPOINT DETECTION SIGNAL FOR RIE PROCESSES, VIA USE OF AN INSITU DRY CLEAN PROCEDURE

[75] Inventor: So Wen Kuo, Hsin-Chu, Taiwan

[73] Assignee: Taiwan Semiconductor Manufacturing Company, Ltd, Hsinchu, Taiwan

[21] Appl. No.: 665,174

[22] Filed: Jun. 14, 1996

[51] Int. Cl.$^6$ .................................................. B08B 7/00
[52] U.S. Cl. ................ 156/643.1; 134/1; 134/1.1
[58] Field of Search ................. 134/1.1, 1; 156/643.1, 156/345; 216/67

[56] References Cited

U.S. PATENT DOCUMENTS

| | | | |
|---|---|---|---|
| 4,960,488 | 10/1990 | Law et al. | 156/643 |
| 5,129,994 | 7/1992 | Ebbing et al. | 156/643 |
| 5,158,644 | 10/1992 | Cheung et al. | 156/643 |
| 5,318,928 | 6/1994 | Gegenwart et al. | 437/235 |
| 5,356,478 | 10/1994 | Chen et al. | 134/1 |
| 5,362,361 | 11/1994 | Tatsumi | 156/662 |
| 5,417,826 | 5/1995 | Blalock | 204/176 |

FOREIGN PATENT DOCUMENTS

| | | | |
|---|---|---|---|
| 404154121 | 5/1992 | Japan | 21/302 |
| 0681175 | 3/1994 | Japan | 21/302 |

*Primary Examiner*—Nam Nguyen
*Assistant Examiner*—Luz Alejandro
*Attorney, Agent, or Firm*—George O. Saile

[57] ABSTRACT

A method of maintaining a strong endpoint detection signal, for RIE processes, has been developed. After numerous RIE procedures have been performed, in a specific RIE chamber, an insitu dry cleaning procedure is implemented to remove polymer from a window in the RIE tool, a window that is used for monitoring endpoint. The insitu dry cleaning procedure is performed using oxygen or chlorine, in the etching chamber of a single wafer RIE tool, while wafers, waiting to be etched, reside in a different chamber of the single wafer RIE tool. The ability to insitu dry clean, results in little interruption in the utilization of the etching function of this tool.

12 Claims, 1 Drawing Sheet

METHOD OF MAINTAINING A STRONG ENDPOINT DETECTION SIGNAL FOR RIE PROCESSES, VIA USE OF AN INSITU DRY CLEAN PROCEDURE

BACKGROUND OF THE INVENTION (1) Field of the Invention

The present invention relates to dry etching procedures used for the fabrication of semiconductor devices, and more specifically to a dry etching sequence that allows a large volume of wafers to be etched without degradation to the endpoint detection signal.

(2) Description of Prior Art

The semiconductor industry is continually striving to increase the performance of semiconductor chips, while still maintaining, or decreasing, the cost of the semiconductor chip. These objectives have been successfully addressed by the trend to micro-miniaturization, or the ability to fabricate semiconductor devices with sub-micron features. Smaller features result in devices with a decrease in performance degrading, parasitic capacitance, as well as decreases in wiring resistances, both allowing higher performing semiconductor devices to be realized. In addition smaller features allow smaller chips to be fabricated, offering the same functionality as the larger counterparts. Thus more, smaller, semiconductor chips can be obtained from a specific size starting substrate, thus reducing the fabrication costs of an individual chip.

The attainment of micro-miniaturization has been aided by advances in specific semiconductor fabrication disciplines, basically photolithography and dry etching. The use of more sophisticated exposure cameras, as well as the use of more sensitive photoresist materials, have allowed sub-micron features to be routinely achieved in photoresist layers. In addition the development of dry etching tools and procedures, have allowed the successful transfer of the sub-micron images, in an overlying photoresist layer, to an underlying material, used in the fabrication of advanced semiconductor devices. Reactive ion etching, (RIE), tools and procedures, now allow single wafer etching to be performed. This allows each specific wafer to be etched individually, with endpoint detection used for only this individual wafer. Thus wafer to wafer uniformity variations, of the layer being patterned using single wafer RIE etching, is not as great a problem as encountered with batch RIE processing. Thus large volumes of wafers can be confidently patterned using single wafer RIE procedures, with a decreased risk of under or overetching due to thickness variations of the material being etched.

A major limitation of dry etching procedures is the ability to maintain a strong endpoint detection signal from wafer to wafer. With the use of single wafer RIE tools, the wafer being etched is moved to the etch chamber of the single wafer RIE tool, which also contains a window, which allows the monitoring of the etching sequence. Laser endpoint detection apparatus monitors the chemistry of the reactants and by-products, through this window. At the conclusion of the etching cycle the chemistry of the by-products will change, and this change will be monitored by the endpoint detection process, which in turn will allow the cessation of the RIE process to occur. If however the window through which the endpoint monitoring becomes layered with adhering RIE by-products, the endpoint detection signal will decrease in intensity, sometimes resulting in erroneous endpoint signals. The major contaminant, or unwanted material, coating the inside of the endpoint detection window, is polymer resulting from the reaction of the RIE reactants, such as $CF_4$ or $CHF_3$, and the material being etched, $SiO_2$ or silicon. This polymer buildup, on the inside walls of the detection window, limits the number of wafers that can be successfully etched, without loss of endpoint signal. The dry etching sectors have usually provided for scheduled maintenance, in terms of physically removing the polymer from the inside surface of the detection window. This is usually accomplished by wet removal of the polymer using a isopropyl alcohol application. This procedure is costly since it terminates the use of the RIE tool for wafer patterning, for approximately 8 hours.

This invention will describe a process in which a dry, insitu clean, is used to remove polymer from the inside surface of the detection window, with the dry clean cycle used as part of the etching sequence in an uninterrupted manner, thus not having to terminate the use of this tool with a physical, wet clean cycle. This dry, insitu clean procedure allows a greater number of wafers to be etched, without degradation of the endpoint detection signal, then was previously experienced, before instituting this procedure. Prior art such as Gegenwart, et al, in U.S. Pat. No. 5,318,928, describe the cleaning of a semiconductor sensor parts, inserted into an etching chamber, by sputtering away impurities from the sensor surface by means of plasma particle bombardment. However that invention is directed towards the manufacture of semiconductor sensors, not towards the cleaning of sensors, or endpoint detection windows, that are already installed in a working plasma. or RIE tool.

SUMMARY OF THE INVENTION

It is an object of this invention to remove polymer from the inside surface of a window used for RIE endpoint detection purposes.

It is another object of this invention to use an oxygen, or chlorine dry clean cycle, in a single wafer RIE tool, to remove polymer from the inside surface of a window used for RIE endpoint detection purposes.

It is yet another object of this invention to use an oxygen or chlorine, dry clean cycle, in the single wafer RIE tool, insitu with the other cycles used to etch wafers.

In accordance with the present invention a method is described for removing polymer from the inside surface of a window, used for endpoint detection, thus allowing a strong endpoint signal to be monitored. After a series of wafers have been reactively ion etched, regarding the removal of unwanted silicon oxide, silicon nitride, or polysilicon, from areas on a semiconductor wafer, unmasked by photoresist, the semiconductor wafers are moved from the etching chamber, and then the etching chamber is subjected to an insitu dry clean, procedure, by the addition of oxygen or chlorine to the chamber, and creating a plasma. After polymer has been removed from the inside surface of the window used for endpoint detection, semiconductor wafers are again moved into the etching chamber for patterning procedures.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of maintaining a strong endpoint detection signal, for single wafer RIE tools, via the use of an insitu, dry clean procedure, will now be described in detail. The patterns being etched are part of structures used in the fabrication metal oxide semiconductor field effect transistors, (MOSFET), devices, currently being manufactured in industry, therefore only the specific areas unique to understanding this invention will be described in detail.

Figure 1:
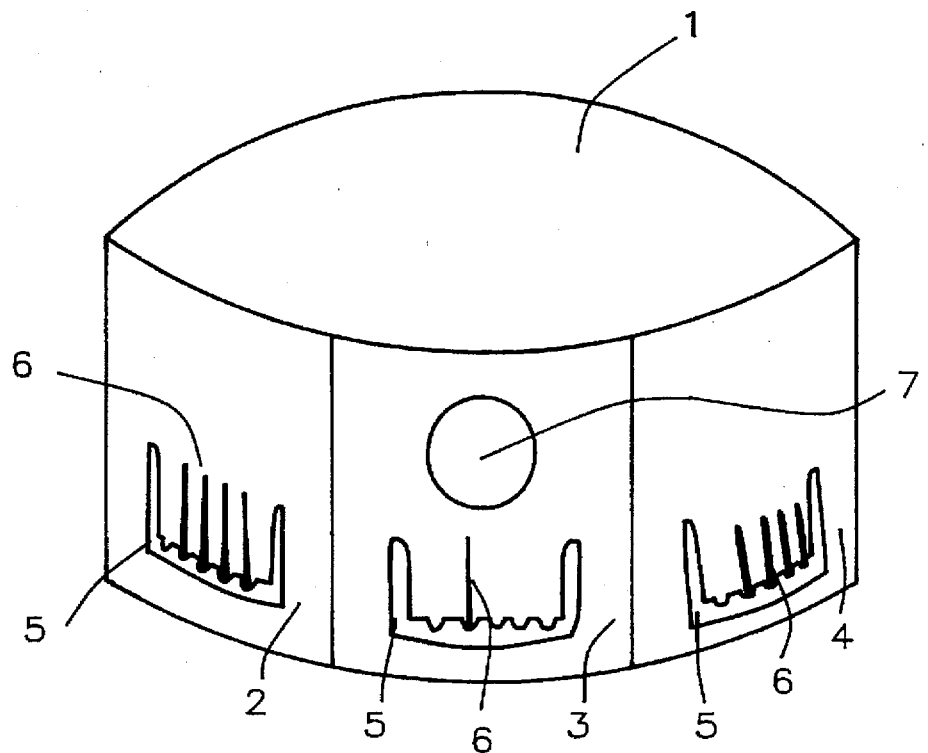
FIG. 1, schematically showing a RIE tool, with a endpoint detection window.

FIG. 1, schematically shows a single wafer RIE tool 1. Chamber 2, is used to hold semiconductor wafers 6, in a wafer boat 5, prior to each individual wafer 6 being transferred to etching chamber 3. Each individual wafer 6, patterned with a photoresist layer, is then subjected to a RIE chemistry to remove unwanted material from unmasked regions, creating the desired images, in the material underlying the photoresist mask. The completion of the etching cycle is monitored via an endpoint detection system, which analyzes the by-products of the RIE procedure, focusing on the plasma in etch chamber 3, through a clear window 7, shown schematically in FIG. 1. After endpoint has been reached, determined via endpoint detect analysis, a short overetch cycle is performed, in etch chamber 3, to insure complete removal of the material being patterned, specifically in areas of the wafer in which thicker material may have existed. At the conclusion of the etching cycle, the specific wafer 6, is transferred to holding chamber 4, joining other wafers that have completed etching, and awaiting removal from single wafer RIE tool 1.

Figure 2:
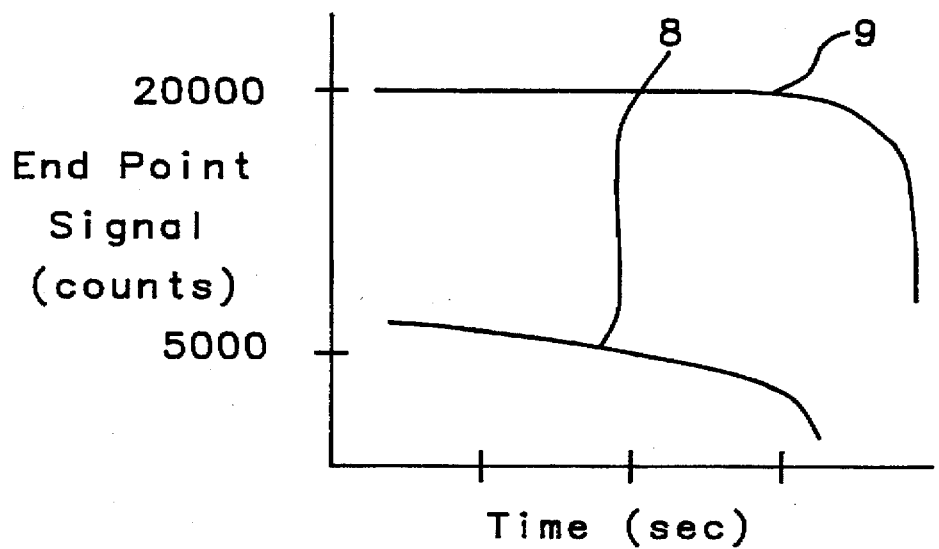
FIG. 2, showing the relationship between the intensity of endpoint detection signal versus time, and also indicating the decrease in endpoint detection signal as a function of number of wafers processed after cleaning of the endpoint detection window.

For example if wafer 6, with patterned photoresist exposing a layer, such as silicon oxide, is etched in etch chamber 3, a RIE reactant such as $CF_4$ or $CHF_3$ will be used to remove the unmasked silicon oxide. During the etching procedure a carbon-oxygen component, (CO), is created from the reaction of $CF_4$ or $CHF_3$, and silicon oxide. The level of CO in the plasma of etch chamber 3, is detected via laser endpoint detection, via monitoring the plasma through window 7. A large decrease in endpoint signal suggests a decrease or absence of CO, therefore suggesting an absence of silicon oxide, thus signifying endpoint has been reached. However during the etching cycle, polymers, comprised of carbon, hydrogen, oxygen and fluorine, are created and coat window 6. After numerous etching cycles the polymer buildup on the inside surface of window 7, can increase to a level in which endpoint detection becomes difficult. FIG. 2, indicates the effect of polymer buildup, on endpoint signal, for a RIE procedure used to pattern silicon oxide. The endpoint trace, that is the endpoint signal, or the level of CO, remains at a constant level until the silicon oxide has been removed, and then the endpoint signal, or CO level rapidly decreases. In FIG. 2, curve 8, shows the endpoint trace for a silicon oxide etching procedure, using window 7, for laser endpoint detection, but in this case window 7, has been subjected to polymer deposition resulting from approximately 3000 wafers being previously etched. Curve 9, in FIG. 2, shows the endpoint trace for the identical silicon oxide etching cycle, however for this case window 7, has only been subjected to polymer deposition resulting from approximately 500 wafers being previously etched. It can be seen that a clearer, more acute endpoint is obtained via use of endpoint detection through the less polymer coated window 7, for curve 9.

In an attempt to obtain sharper endpoint detection, semiconductor fabrication engineers physically remove the polymer coated on the inside surface of window 7, after a finite amount of wafers have been etched. This is accomplished by shutting down the RIE tool and using a wet clean, such as a chemical solution, containing isopropyl alcohol, to remove the polymer. The amount of time needed to remove the polymer, and ready the tool for subsequent use, can be considerable, significantly reducing the tools usage, and increasing the turn around time needed to fabricate the finished semiconductor chips.

A process designed to minimize tool downtime, while maintaining strong endpoint detection signals will now be described. At the conclusion of between about 2500 to 3000 wafers, between about 150 to 250 mm in diameter, being etched, an insitu, dry cleanup of the polymer formation on window 7, is initiated. After these 2500 to 3000 wafers, have been processed through etch chamber 3, that is the etching of silicon oxide using $CHF_3$ or $CF_4$ as etchants, or HBr as an etchant for silicon nitride layers, or $SF_6$ used for polysilicon patterning, etch chamber 3, is emptied of wafers, by transferring the finished wafers to holding chamber 4, while etch chamber 3, is subjected to the insitu dry clean, removing polymer from window 7. This is accomplished by injecting between about 50 to 150 sccm of oxygen into etch chamber 3 and then creating a plasma. The temperature inside etch chamber 3, is between about 50° to 100° C., at a pressure between about 800 to 900 mTorr. This procedure is performed for between about 0.1 to 1.0 min. At the conclusion of the insitu dry clean process, wafers residing in chamber 2, can now be transferred to etch chamber 3, to resume patterning, by injecting the reactants and creating a plasma, and using a clean window 7, for strong endpoint detection. The endpoint detection signal, obtained using an insitu cleaned, window 7, results in a signal identical to strong and accurate trace shown in curve 9, of FIG. 2. This insitu, dry clean procedure reduces the amount of downtime the RIE system would have experienced if the use of a wet cleanup of polymer, from window 7, had been used.

What is claimed is:

1. A method of in situ dry cleaning a RIE tool, using 100% oxygen gas, in a plasma, with said in situ dry cleaning procedure performed for a time period between 0.1 to 1.0 minutes, to remove polymer from the inside surface of a window, wherein said window is used as a port to monitor endpoint detection, comprising:

terminate the etching of semiconductor wafers in etching chamber of said RIE tool;

transfer said semiconductor wafers from said etching chamber of said RIE tool, to a holding chamber of said RIE tool;

remove polymer from inside surface of said window, in said etching chamber, by injecting a flow of 100% oxygen gas, into etching chamber, creating a plasma, and performing in situ clean for a period of time between 0.1 to 1.0 minutes;

terminate said plasma, and terminate flow of said 100% oxygen gas; and recommence etching of said semiconductor wafers in said etching chamber, of said RIE tool.

2. The method of claim 1, wherein said RIE tool is a single wafer RIE tool.

3. The method of claim 1, wherein said RIE tool is a batch type tool.

4. The method of claim 1, in which the number of said semiconductor wafers etched in said etching chamber, prior to initiating said insitu dry clean procedure, is between about 2500 to 3000, having a diameter between about 150 to 250 mm.

5. The method of claim 1, wherein said insitu dry cleaning procedure, is performed at a temperature between about 50° to 100° C.

6. The method of claim 1, wherein said insitu dry cleaning procedure is performed at a pressure between about 800 to 900 mTorr.

7. The method of claim 1, wherein said in situ dry cleaning procedure, used to remove said polymer from said inside surface of said window, in said etching chamber, is performed using 100% oxygen gas, at a flow between about 50 to 150 sccm.

8. The method of claim 1 wherein said polymer removed from said inside surface of said window, in said etching chamber, by said insitu dry cleaning procedure, is comprised of carbon, hydrogen, oxygen and fluorine.

9. A method of maintaining a strong endpoint detection signal, for etching semiconductor wafers in a single wafer RIE tool, by use of an insitu dry cleaning procedure, comprised of injecting 100% oxygen gas into an etching chamber, creating a plasma, and performing an in situ clean, for a time period between about 0.1 to 1.0 minutes, in said etching chamber of said single wafer tool, to remove deposited polymer from the inside surface of a window, in said etching chamber, wherein said window is used as a port for monitoring of RIE endpoint, comprising:

terminate the etching of said semiconductor wafers in said etching chamber of said single wafer RIE tool;

transfer said semiconductor wafers from said etching chamber to a holding chamber, in said single wafer RIE tool;

remove said polymer from said etching chamber, including removal of said polymer from inside surface of said window, by use injecting said 100% oxygen gas, at a flow between about 50 to 150 sccm, into said etching chamber, creating a plasma, and in situ cleaning at a temperature between about 50° to 100° C., for a time period between about 0.1 to 1.0 minutes;

terminate said in situ dry cleaning procedure by terminating said plasma and by stopping 100% oxygen flow; and recommence etching of said semiconductor wafers, in said etching chamber, of said single wafer RIE tool.

10. The method of claim 9, wherein the number of said semiconductor wafers etched in said etching chamber, prior to initiating said insitu dry cleaning procedure, is between about 2500 to 3000, and having a diameter between about 150 to 250 mm.

11. The method of claim 9, wherein said insitu dry cleaning procedure is performed at a pressure between about 800 to 900 mTorr.

12. The method of claim 10, wherein said polymer, removed from said inside surface of said window, in said etching chamber, by said insitu dry cleaning procedure, is comprised of carbon, hydrogen, oxygen and fluorine.

* * * * *